United States Patent
Ivan et al.

(10) Patent No.: US 9,295,186 B2
(45) Date of Patent: Mar. 22, 2016

(54) ELECTROMAGNETIC INTERFERENCE REDUCTION ASSEMBLY FOR A TRANSMISSION OF A VEHICLE

(71) Applicant: GM GLOBAL TECHNOLOGY OPERATIONS LLC, Detroit, MI (US)

(72) Inventors: William T. Ivan, Shelby Township, MI (US); Jeremy B. Campbell, Torrance, CA (US); Konstantinos Triantos, Huntington Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 319 days.

(21) Appl. No.: 13/745,025

(22) Filed: Jan. 18, 2013

(65) Prior Publication Data

US 2014/0204555 A1    Jul. 24, 2014

(51) Int. Cl.
| | |
|---|---|
| *H05K 9/00* | (2006.01) |
| *H05K 5/00* | (2006.01) |
| *B60L 11/12* | (2006.01) |
| *B60L 11/14* | (2006.01) |
| *B60L 15/00* | (2006.01) |
| *F16H 57/02* | (2012.01) |

(52) U.S. Cl.
CPC ............ *H05K 9/0007* (2013.01); *B60L 11/123* (2013.01); *B60L 11/14* (2013.01); *B60L 15/007* (2013.01); *F16H 57/02* (2013.01); *H05K 5/0082* (2013.01); *B60L 2210/40* (2013.01); *F16H 2057/02034* (2013.01)

(58) Field of Classification Search
CPC ............. B60K 6/20; B60K 6/22; B60K 6/24; B60K 6/26; H05K 5/0082; F16H 2057/02034; H01R 13/65802; G02B 6/4277
USPC ........................................... 361/818; 174/351
See application file for complete search history.

(56) References Cited

U.S. PATENT DOCUMENTS 6,166,498 A * 12/2000 Yamaguchi et al. ............ 318/34
6,822,879 B2 * 11/2004 Rathnam et al. .............. 361/818
(Continued)

FOREIGN PATENT DOCUMENTS

| CN | 202094756 U | 12/2011 |
|---|---|---|
| JP | 09298381 A | 11/1997 |
| WO | WO 2012/090381 | * 11/2011 |

OTHER PUBLICATIONS

Front page of wipo publication WO2012090381.*

*Primary Examiner* — Tuan T Dinh
*Assistant Examiner* — Mukund G Patel
(74) *Attorney, Agent, or Firm* — Quinn Law Group, PLLC

(57) ABSTRACT

An electromagnetic interference reduction assembly for a transmission is disclosed. A transmission casing includes a base and walls extending outwardly away from the base to a distal edge. The transmission casing defines a first cavity between the walls and includes a platform disposed between the walls. A power inverter module is disposed in the first cavity and supported by the platform when in the first cavity. The power inverter module generates electrical noise during operation which produces electromagnetic interference. A lid is attached to the distal edge of the walls to contain the power inverter module inside the first cavity. A grounding member engages the power inverter module and the lid when the lid is attached to the transmission casing to electrically connect the power inverter module to the lid to reduce the electrical noise exiting the first cavity which reduces the electromagnetic interference exiting the first cavity.

20 Claims, 5 Drawing Sheets

(56) References Cited

U.S. PATENT DOCUMENTS

| | | |
|---|---|---|
| 2002/0101720 A1 | 8/2002 | Kline et al. |
| 2009/0147493 A1 | 6/2009 | Wu |
| 2012/0287588 A1 | 11/2012 | Muterspaugh et al. |
| 2013/0294040 A1 * | 11/2013 | Fukumasu et al. ............ 361/752 |

* cited by examiner

ELECTROMAGNETIC INTERFERENCE REDUCTION ASSEMBLY FOR A TRANSMISSION OF A VEHICLE

TECHNICAL FIELD

The present disclosure relates to an electromagnetic interference reduction assembly for a transmission of a vehicle.

BACKGROUND

Power inverter modules can be utilized to control electric motors of hybrid vehicles. Electrical signals to and from the power inverter module causes the power inverter module to generate electromagnetic interference.

SUMMARY

The present disclosure provides an electromagnetic interference reduction assembly for a transmission of a vehicle. The assembly includes a transmission casing. The transmission casing includes a base and a plurality of walls extending outwardly away from the base to a distal edge. The transmission casing defines a first cavity between the walls and includes a platform disposed between the walls to further define the first cavity. The assembly further includes a power inverter module disposed in the first cavity and supported by the platform when in the first cavity. The power inverter module generates electrical noise during operation which produces electromagnetic interference. The assembly also includes a lid attached to the distal edge of the walls of the transmission casing to contain the power inverter module inside the first cavity. In addition, the assembly includes a grounding member engaging the power inverter module and the lid when the lid is attached to the transmission casing to electrically connect the power inverter module to the lid to reduce the electrical noise exiting the first cavity which reduces the electromagnetic interference exiting the first cavity.

The present disclosure also provides an electromagnetic interference reduction assembly for a transmission of a vehicle. The assembly includes a transmission casing. The transmission casing includes a base and a plurality of walls extending outwardly away from the base to a distal edge. The transmission casing defines a first cavity and a second cavity between the walls and includes a platform disposed between the walls to separate the first and second cavities. The first cavity is disposed adjacent to the distal edge of each of the walls. The assembly further includes a power inverter module disposed in the first cavity and supported by the platform when in the first cavity. The power inverter module generates electrical noise during operation which produces electromagnetic interference. A connector plug extends from the power inverter module for electrically connecting the power inverter module to the vehicle. The assembly also includes a lid attached to the distal edge of the walls of the transmission casing to contain the power inverter module inside the first cavity. The connector plug extends through the lid. In addition, the assembly includes a grounding member disposed about the connector plug and including a plurality of tabs spaced from each other about the connector plug. The grounding member engages the power inverter module and each of the tabs engage the lid when the lid is attached to the transmission casing to electrically connect the power inverter module to the lid to reduce the electrical noise exiting the first cavity which reduces the electromagnetic interference exiting the first cavity.

The detailed description and the drawings or Figures are supportive and descriptive of the disclosure, but the scope of the disclosure is defined solely by the claims. While some of the best modes and other embodiments for carrying out the claims have been described in detail, various alternative designs and embodiments exist for practicing the disclosure defined in the appended claims.

DETAILED DESCRIPTION

Figure 1:
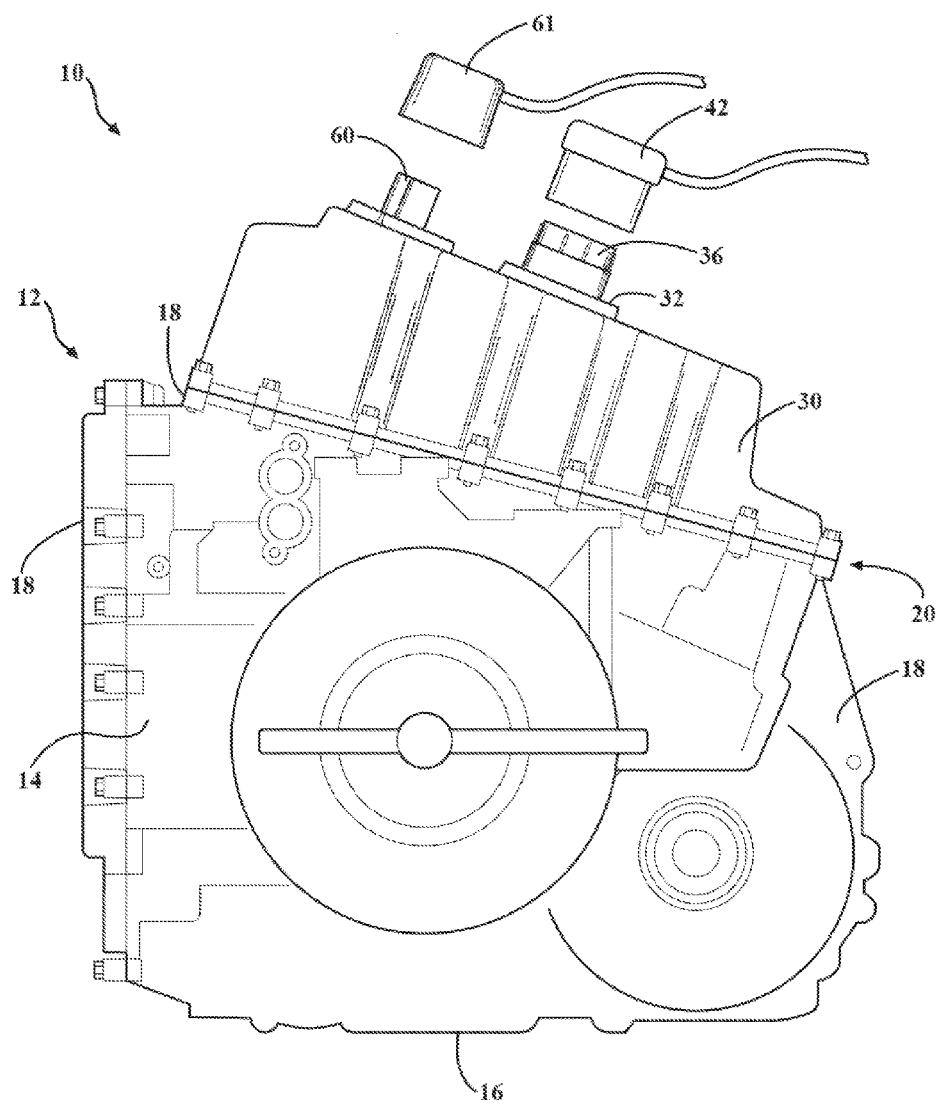
FIG. 1 is a schematic side view of an electromagnetic interference reduction assembly with a cable harness and a wire harness exploded from a transmission casing.
Figure 2:
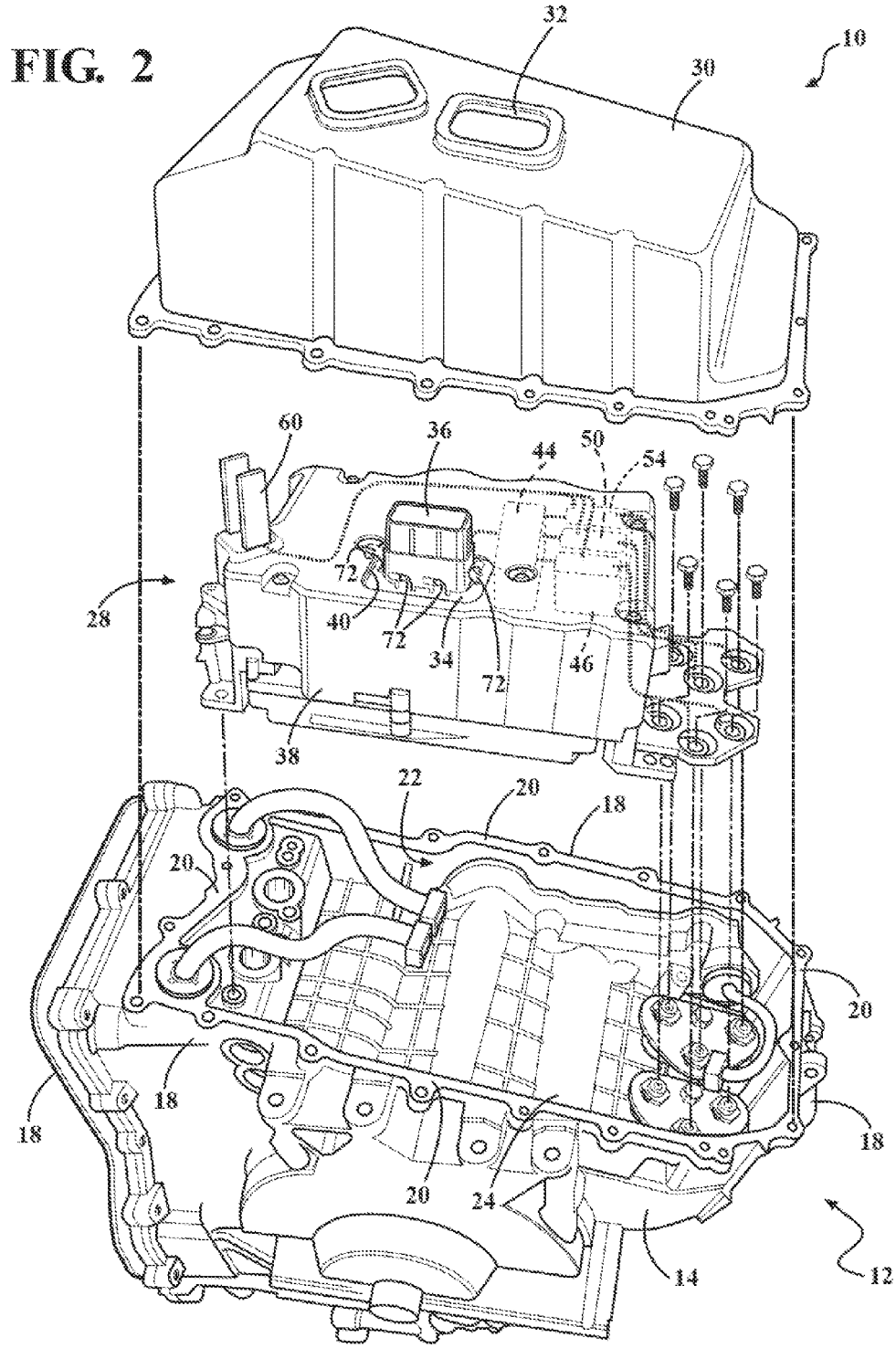
FIG. 2 is a schematic partially exploded perspective view of the electromagnetic interference reduction assembly.

Referring to the Figures, wherein like numerals indicate like or corresponding parts throughout the several views, an electromagnetic interference reduction assembly 10 for a transmission 12 of a vehicle is generally shown in FIGS. 1 and 2. Generally, the transmission 12 can be an electrically-variable transmission 12 as discussed further below or any other suitable transmission 12. Therefore, the transmission 12 discussed herein can be for a hybrid vehicle or any other suitable vehicle. It is to also be appreciated that the electromagnetic interference reduction assembly 10 can be utilized with components other than the transmission 12.

Figure 3:
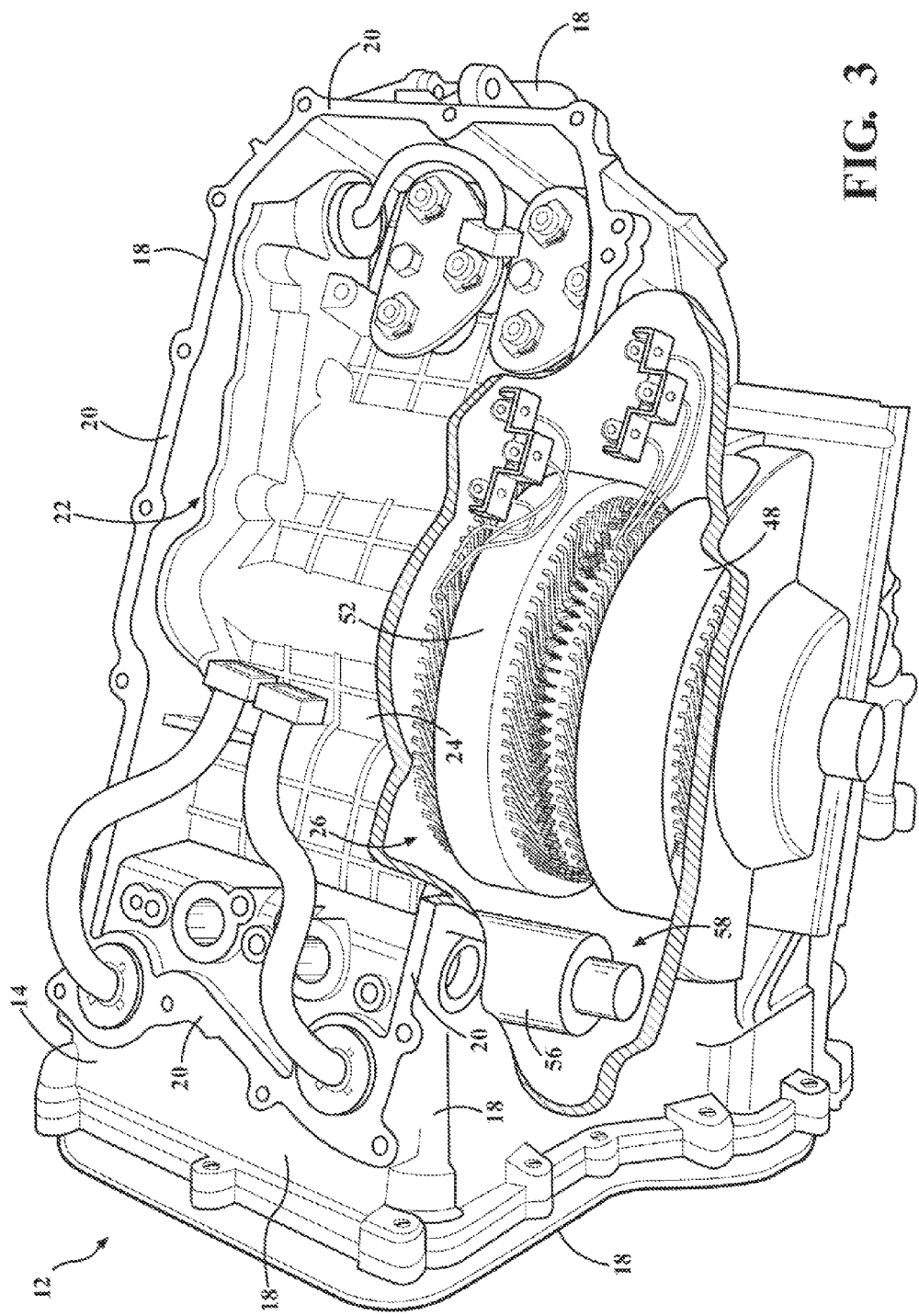
FIG. 3 is a schematic perspective broken view of the transmission casing with a pump, a first motor/generator and a second motor/generator each disposed in a second cavity.

Referring to FIGS. 1-3, the electromagnetic interference reduction assembly 10 includes a transmission casing 14 mounted to the vehicle. The transmission casing 14 includes a base 16 and a plurality of walls 18 extending outwardly away from the base 16 to a distal edge 20. The transmission casing 14 defines a first cavity 22 between the walls 18 and includes a platform 24 disposed between the walls 18 to further define the first cavity 22. Generally, the first cavity 22 is disposed adjacent to the distal edge 20 of each of the walls 18. In certain embodiments, the transmission casing 14 defines the first cavity 22 and a second cavity 26 (see FIG. 3) between the walls 18, with the platform 24 disposed between the walls 18 to separate the first and second cavities 22, 26.

As best shown in FIGS. 2 and 3, the electromagnetic interference reduction assembly 10 further includes a power inverter module 28 disposed in the first cavity 22 and supported by the platform 24 when in the first cavity 22. Generally, high voltage is fed to the power inverter module 28 to operate various components, some of which are discussed below, inside the transmission casing 14. Therefore, the power inverter module 28 can be referred to as a high voltage module or high power module.

In addition, signals, such as electrical signals, are input into the power inverter module 28 to operate various components inside the module 28 and signals are output from the power inverter module 28 to communicate with other components of the vehicle. The power inverter module 28 generates electrical noise during operation which produces electromagnetic interference. Therefore, the electromagnetic interference reduction assembly 10 decreases an amount of electrical noise exiting the first cavity 22, and thus decreases an amount of electromagnetic interference exiting the first cavity 22. For example, the signals to and from the electrical components operating inside the power inverter module 28 generates electrical noise which produces electromagnetic interference. This electrical noise can be referred to as common mode noise.

Turning to FIGS. 1 and 2, the electromagnetic interference reduction assembly 10 also includes a lid 30 coupled or attached to the transmission casing 14. More specifically, the lid 30 is attached to the distal edge 20 of the walls 18 of the transmission casing 14 to contain the power inverter module 28 inside the first cavity 22. Generally, the lid 30 can define an outlet 32 (see FIGS. 2 and 5), in which the electrical noise produced by the power inverter module 28 can exit or escape. It is to be appreciated that the transmission casing 14 and/or the lid 30 can be generally referred to as a housing. It is to further be appreciated that the electromagnetic interference reduction assembly 10 can be utilized with any suitable housing and any suitable power inverter module 28.

The transmission casing 14 and the lid 30 act as a housing ground to electrically connect the power inverter module 28 to the lid 30 and thus the transmission casing 14 as discussed further below. The transmission casing 14 and the lid 30 can be formed of a metal material. In one embodiment, the metal material of the transmission casing 14 and the lid 30 is steel. In another embodiment, the metal material of the transmission casing 14 and the lid 30 is aluminum. It is to be appreciated that the transmission casing 14 and the lid 30 can be formed of the same metal material or different metal materials. It is to also be appreciated that any suitable metal material(s) can be utilized for the transmission casing 14 and the lid 30.

Figure 4:
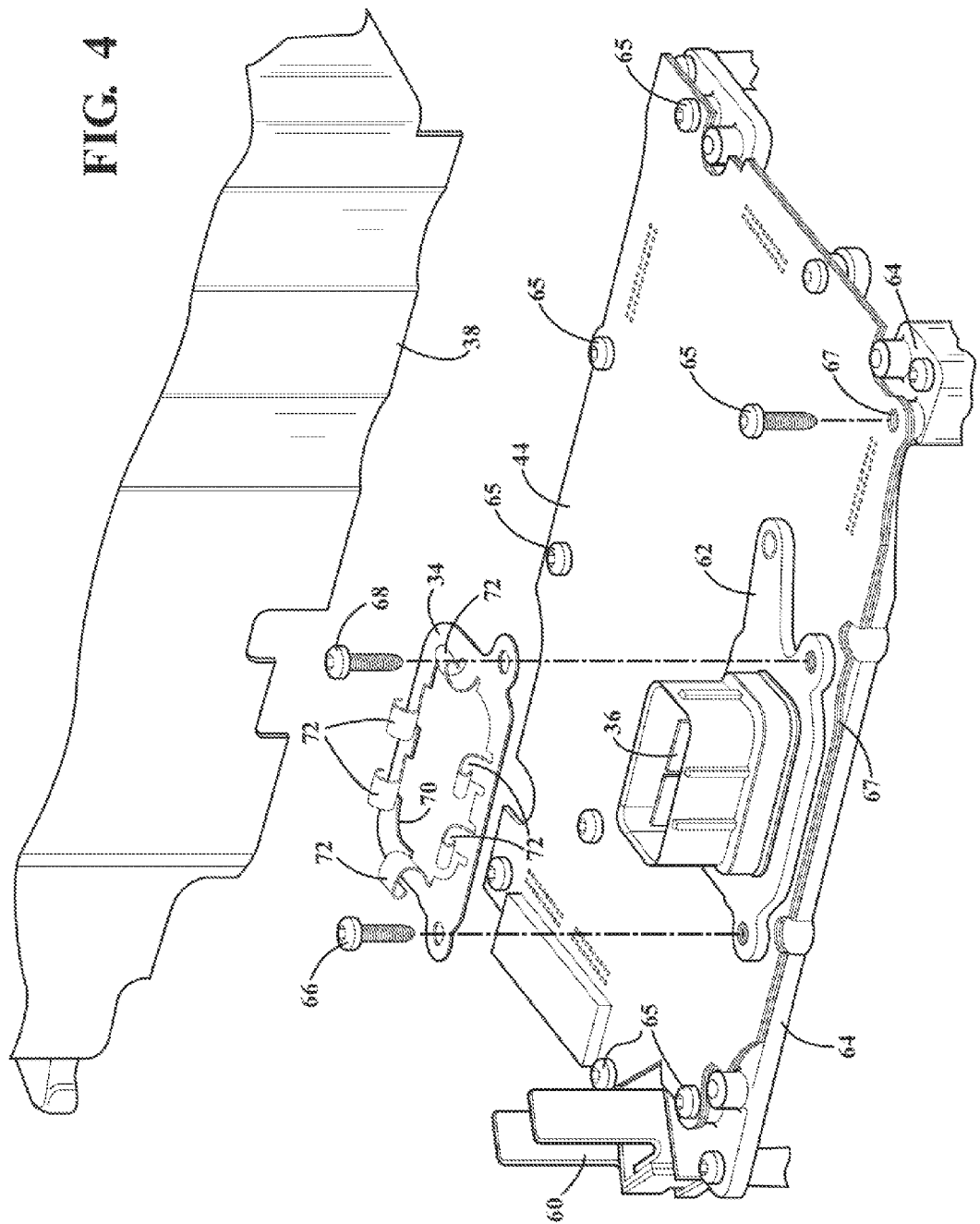
FIG. 4 is a schematic partially exploded perspective view of the power inverter module.

In addition, referring to FIGS. 2 and 4, the electromagnetic interference reduction assembly 10 includes a grounding member 34 engaging the power inverter module 28 and the lid 30 when the lid 30 is attached to the transmission casing 14 to electrically connect the power inverter module 28 to the lid 30 to reduce the electrical noise exiting the first cavity 22 which reduces the electromagnetic interference exiting the first cavity 22. More specifically, the electrical noise can exit the first cavity 22 through the outlet 32, and therefore, the grounding member 34 reduces the electrical interference exiting through the outlet 32. Generally, the grounding member 34 returns the electrical noise back inside the first cavity 22 and/or to the power inverter module 28 which reduces the electromagnetic interference exiting the first cavity 22. Simply stated, the grounding member 34 returns at least some of the electrical noise inside the transmission casing 14 which reduces the electromagnetic interference exiting the first cavity 22. The grounding member 34 minimizes a difference in potential between the power inverter module 28 and the lid 30, and thus the transmission casing 14, which reduces the electromagnetic interference exiting the first cavity 22. In certain embodiments, the potential between the power inverter module 28 and the lid 30, and thus the transmission casing 14, is the same when utilizing the grounding member 34. Generally, the grounding member 34 can be utilized to minimize a difference in potential between any suitable power inverter module 28 and any suitable housing.

Generally, the grounding member 34 is formed of a conductive material. In one embodiment, the conductive material of the grounding member 34 is copper. In another embodiment, the conductive material of the grounding member 34 is beryllium copper. In yet another embodiment, the conductive material of the grounding member 34 is steel. It is to be appreciated that the grounding member 34 can be formed of other conductive materials, such as for example, brass, silver plated steel, gold plated steel, or any other suitable conductive material(s). Generally, the grounding member 34 is formed of low cost and low mass materials, thus providing a way to keep costs down.

Turning to FIGS. 1, 2 and 4, the electromagnetic interference reduction assembly 10 can include a connector plug 36 extending from the power inverter module 28 for electrically connecting the power inverter module 28 to the vehicle. In other words, the power inverter module 28 can communicate with other components of the vehicle through the connector plug 36. Furthermore, optionally, the power inverter module 28 can include a cover 38 defining a hole 40, with the connector plug 36 extending through the hole 40. Therefore, generally, the connector plug 36 extends through the cover 38. In addition, the connector plug 36 extends through the lid 30 and allows input signals into the power inverter module 28 and output signals out of the power inverter module 28. More specifically, the connector plug 36 is disposed through the outlet 32; and therefore, the electrical noise exits the first cavity 22 through the outlet 32 such that the electromagnetic interference exits the first cavity 22 through the outlet 32. Simply stated, electromagnetic interference exits the first cavity 22 through the connector plug 36, and thus exits through the outlet 32 of the lid 30. The connector plug 36 can be referred to as a low voltage input/output signal connector.

Furthermore, referring to FIG. 1, the electromagnetic interference reduction assembly 10 can include a wire harness 42 coupled to the connector plug 36 for electrically connecting the power inverter module 28 to the vehicle. Therefore, generally, signals enter and exit the power inverter module 28 through the connector plug 36 by the wire harness 42. As such, the power inverter module 28 can communicate with other components of the vehicle through the connector plug 36 and the wire harness 42. As such, the wire harness 42 provides input signals to the power inverter module 28 and output signals out of the power inverter module 28. The generated electrical noise, and thus the electromagnetic interference, can exit the first cavity 22 via the wire harness 42. The grounding member 34 returns the electrical noise back to power inverter module 28 before the electrical noise can exit through the wire harness 42. Therefore, the grounding member 34 does not allow all of the electrical noise to exit out through the wire harness 42. Said differently, the grounding member 34 returns the common mode noise back to the power inverter module 28 instead of allowing all of the common mode noise to exit out through the wire harness 42.

Turning to FIGS. 2 and 4, the power inverter module 28 can include a circuit board 44 electrically connected to the connector plug 36 for electrically connecting the power inverter module 28 to the vehicle. Generally, the cover 38 of the power inverter module 28 is disposed over the circuit board 44. The circuit board 44 can communicate with other components of the vehicle through the wire harness 42. Therefore, signals can be communicated to and from the power inverter module 28 through the wire harness 42. Specifically, the circuit board 44 is in communication with the wire harness 42 such that signals to and from other components of the vehicle can communicate with the circuit board 44. Generally, the circuit board 44 can be a controller for the power inverter module 28.

Referring to FIGS. 2 and 3, the circuit board 44 can control a first inverter 46 electrically connected to a first motor/generator 48, a second inverter 50 electrically connected to a second motor/generator 52 and a third inverter 54 electrically connected to a motor 56 of a pump 58. The first, second and third inverters 46, 50, 54 convert direct current energy, entering the power inverter module 28 through an input connector 60, into alternating current energy which is delivered or supplied to the respective first motor/generator 48, the second motor/generator 52 and the motor 56 of the pump 58. As mentioned above, the power inverter module 28 can be referred to as a high voltage or high power module, which at least partially relates to the direct current energy entering the module 28. A cable harness 61 (see FIG. 1) can be coupled to the input connector 60 to supply the direct current energy to the power inverter module 28.

The circuit board 44 controls which of the first, second and third inverters 46, 50, 54 are to be activated to supply alternating current energy to the first and second motor/generators 48, 52 and/or the motor 56 of the pump 58 to operate the first and second motor/generators 48, 52 and/or the motor 56 of the pump 58. Therefore, the power inverter module 28 is utilized to supply the alternating current energy to the first and second motor/generators 48, 52 and the motor 56 of the pump 58, as well as to control the first and second motor/generators 48, 52 and the motor 56 of the pump 58. Generally, electrically-variable transmissions 12 utilize the first and second motor/generators 48, 52 in hybrid vehicles. It is to be appreciated that the circuit board 44 and the first, second and third inverters 46, 50, 54 are shown schematically in the power inverter module 28 of FIG. 2 for illustrative purposes only and the configuration/location of the circuit board 44 and the first, second and third inverters 46, 50, 54 can change. It is to further be appreciated that more than one circuit board 44 can be disposed in the power inverter module 28. It is to also be appreciated that some of the communications are shown in evenly spaced dashes in FIG. 2 for illustrative purposes only.

Optionally, the electromagnetic interference reduction assembly 10 can further include an insulator 62 (see FIG. 4) disposed about the connector plug 36. Generally, the insulator 62 is disposed between the circuit board 44 and the grounding member 34 to prevent short circuiting of the circuit board 44. In other words, the insulator 62 prevents the grounding member 34 from short circuiting various circuits inside the circuit board 44. The insulator 62 can be any suitable configuration to prevent short circuiting of the circuit board 44.

The insulator 62 can be formed of a non-conductive material to insulate the circuit board 44 and the grounding member 34 from each other. In one embodiment, the non-conductive material of the insulator 62 is a polymeric material. In one embodiment, the polymeric material of the insulator 62 is plastic. It is to be appreciated that any suitable non-conductive material can be utilized for the insulator 62.

Continuing with FIG. 4, the power inverter module 28 can also include a grounding plate 64. For example, the grounding plate 64 can be disposed inside the cover 38 of the power inverter module 28. The circuit board 44 is electrically connected to the grounding plate 64 through one or more fasteners 65. It is to be appreciated that the fasteners 65 can be any suitable configuration to electrically connect the circuit board 44 to the grounding plate 64.

The grounding plate 64 and the fasteners 65 can each be formed of a metal material. In one embodiment, the metal material of the grounding plate 64 and the fasteners 65 are steel. In another embodiment, the metal material of the grounding plate 64 and the fasteners 65 are aluminum. It is to be appreciated that the grounding plate 64 and the fasteners 65 can be formed of the same metal material or different metal materials. It is to further be appreciated that the grounding plate 64 and the fasteners 65 can be formed of any suitable metal material(s).

Generally, the grounding member 34 is electrically coupled to the grounding plate 64 to electrically connect the power inverter module 28 to the lid 30, and thus the transmission casing 14. More specifically, the grounding member 34 is electrically connected to the grounding plate 64 through a circuit board grounding layer 67 (see FIG. 4) disposed in the circuit board 44, which will be discussed further below. The grounding member 34 provides a low impedance connection between the grounding plate 64 in the power inverter module 28 and the lid 30 which returns the common mode noise back to power inverter module 28 instead of allowing all of the common mode noise to exit out through the wire harness 42.

Generally, the circuit board grounding layer 67 can be formed of a conductive material. In one embodiment, the conductive material of the grounding layer 67 is copper. It is to be appreciated that the grounding layer 67 can be formed of any other suitable conductive material(s). It is to be appreciated that the circuit board grounding layer 67 is shown schematically in FIG. 4 for illustrative purposes only and the configuration/location of this grounding layer 67 can change.

Again, continuing with FIG. 4, a first coupler 66 can be attached to the grounding member 34 and the circuit board 44 to connect together the grounding member 34 and the circuit board 44. In certain embodiments, a second coupler 68 can be attached to the grounding member 34 and the circuit board 44 to connect together the grounding member 34 and the circuit board 44. Generally, the second coupler 68 is spaced from the first coupler 66. Specifically, the first and second couplers 66, 68 electrically connect the grounding member 34 and the circuit board 44. More specifically, the first and/or second couplers 66, 68 electrically connect the grounding member 34 to the circuit board grounding layer 67. Therefore, the grounding member 34 is electrically connected to the grounding plate 64 through the first and/or second couplers 66, 68 engaging the grounding member 34 and the circuit board grounding layer 67, and through the fasteners 65 engaging the circuit board grounding layer 67 and the grounding plate 64. It is to be appreciated that any suitable number of couplers 66, 68 can be utilized and the couplers 66, 68 can be fasteners or any other suitable configuration. The grounding member 34 is easy to assemble to the power inverter module 28 by utilizing the couplers 66, 68, thus keeping assembly costs down.

The first and second couplers 66, 68 can be formed of a conductive material. In one embodiment, the conductive material of the couplers 66, 68 is copper. It is to be appreciated that the couplers 66, 68 can be formed of other conductive materials, such as for example, brass, silver plated steel, gold plated steel, or any other suitable conductive material(s). It is to be appreciated that the couplers 66, 68 can be formed of the same conductive material or different conductive materials.

Turning back to the grounding member 34, the grounding member 34 can be disposed about the connector plug 36 (see FIGS. 2 and 4). In certain embodiments, the grounding member 34 can define an aperture 70, with the connector plug 36 disposed through the aperture 70 such that the grounding member 34 surrounds the connector plug 36. Furthermore, the grounding member 34 can include at least one tab 72 extending outwardly toward the lid 30. The tab 72 engages the lid 30 when the lid 30 is attached to the transmission casing 14 to return the electrical noise back inside the first cavity 22 to the power inverter module 28 away from the outlet 32 to reduce the electromagnetic interference exiting the outlet 32. In other words, the tab 72 electrically connect the power inverter module 28 to the lid 30 and the transmission casing 14 which returns at least some of the electrical noise back to the power inverter module 28 instead of allowing all of the electrical noise to exit the first cavity 22, and specifically, exit the outlet 32.

Figure 5:
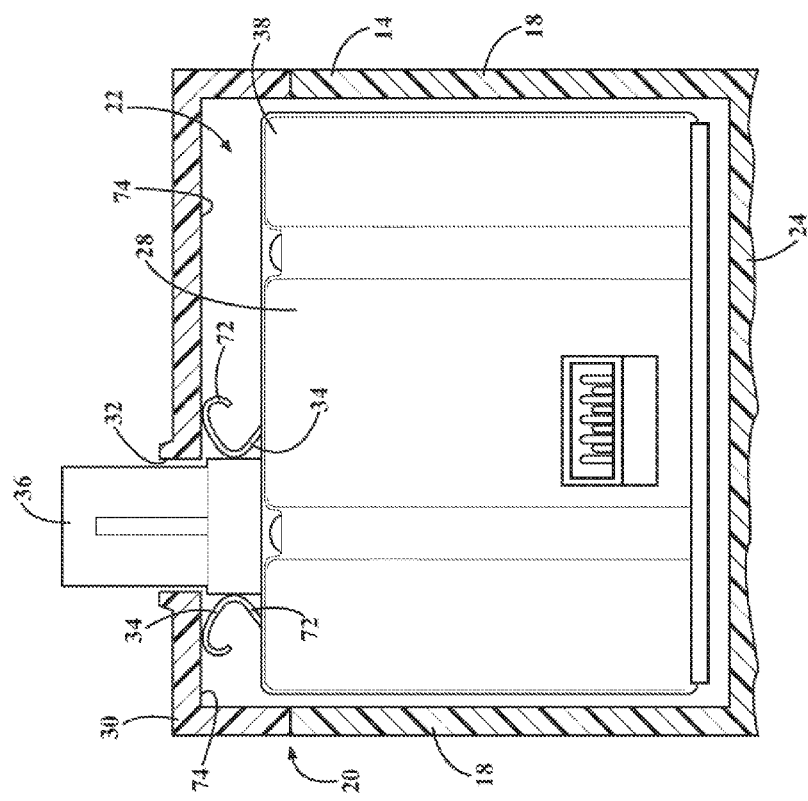
FIG. 5 is a schematic broken partially cross-sectional view of a power inverter module inside a first cavity of the transmission casing.

Referring to FIGS. 2, 4 and 5, in one embodiment, the at least one tab 72 is further defined as a plurality of tabs 72 spaced from each other about the connector plug 36. Generally, each of the tabs 72 engage the lid 30 when the lid 30 is attached to the transmission casing 14 to return the electrical noise back inside the first cavity 22 to the power inverter module 28 away from the outlet 32 to reduce the electromagnetic interference exiting the outlet 32. More specifically, the grounding member 34 engages the power inverter module 28 and each of the tabs 72 engage the lid 30 when the lid 30 is attached to the transmission casing 14 to electrically connect the power inverter module 28 to the lid 30 and thus the transmission casing 14 to reduce the electrical noise exiting the first cavity 22, and specifically exiting the outlet 32, which reduces the electromagnetic interference exiting the first cavity 22, and specifically exiting the outlet 32. Generally, the lid 30 can include an inner surface 74 (see FIG. 5) facing inside the first cavity 22 when the lid 30 is attached to the transmission casing 14, with the tabs 72 of the grounding member 34 engaging the inner surface 74 to electrically connect the power inverter module 28 to the lid 30 and the transmission casing 14. In certain embodiments, the tabs 72 extend through the hole 40 of the cover 38 such that the tabs 72 are exposed outside of the cover 38 to engage the inner surface 74 of the lid 30 when the lid 30 is attached to the transmission casing 14.

As discussed above, the grounding member 34 can be formed of the conductive material. In addition, the conductive material of the grounding member 34 is also elastic such that the grounding member 34 has conductive properties and elastic properties. In one embodiment, the grounding member 34 can be formed of steel such that the tabs 72 are elastically deformable when engaging the lid 30 to maintain engagement of the tabs 72 with the lid 30. In another embodiment, the grounding member 34 can be formed of beryllium copper such that the tabs 72 are elastically deformable when engaging the lid 30 to maintain engagement of the tabs 72 with the lid 30. Therefore, one or more of the tabs 72 can flex or bend when engaging the lid 30 to maintain engagement between the tabs 72 and the lid 30. More specifically, the tabs 72 can flex or bend to maintain engagement with the inner surface 74 of the lid 30. In addition, the tabs can flex or bend to compensate for manufacturing tolerance. Furthermore, since the tabs 72 are elastically deformable, the tabs 72 can bias to spring back to its original configuration when the lid 30 is removed. It is to be appreciated that the tabs 72 can be any suitable configuration to engage the lid 30. The grounding member 34 can be referred to as a grounding spring due to the tabs 72 being elastically deformable or bias-able. It is to be appreciated that the grounding member 34 can be formed of other conductive and elastic materials, such as for example, copper, brass, silver plated steel, gold plated steel, or any other suitable conductive and elastic materials.

Figure 6:
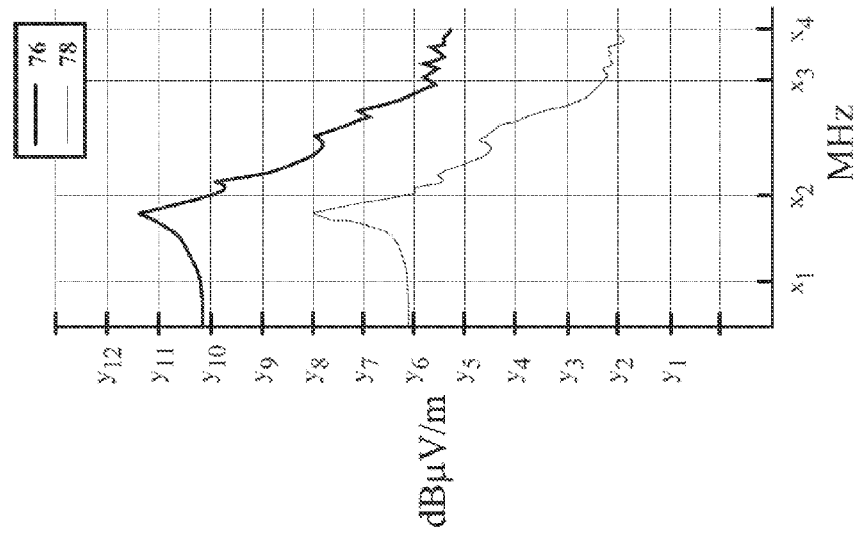
FIG. 6 is a schematic chart of the decibels in microvolts per meter produced with and without a grounding member over the frequency in megahertz.

Referring to the graph of FIG. 6, a heavy-weighted line 76 represents the electrical noise exiting the first cavity 22, and specifically exiting the outlet 32, when the grounding member 34 is removed from the power inverter module 28 and a light-weighted line 78 represents the electrical noise exiting the first cavity 22, and specifically exiting the outlet 32, when the grounding member 34 is being utilized in the power inverter module 28. The graph of FIG. 6 is labeled as decibels in microvolts per meter (dB µV/m) relative to megahertz (MHz). As indicated by the differences in these lines 76, 78, the electrical noise exiting the first cavity 22 is reduced when utilizing the grounding member 34. In other words, the electrical noise exiting through the wire harness 42 is reduced when utilizing the grounding member 34. For example, in certain embodiments, the electrical noise exiting the first cavity 22 through the outlet 32 is reduced by from about 10 dB to about 20 dB over a range of from about 40 MHz to about 60 MHz. In other embodiments, the electrical noise exiting the first cavity 22 through the outlet 32 is reduced by from about 13 dB to about 18 dB over a range of from about 45 MHz to about 55 MHz. In yet other embodiments, the electrical noise exiting the first cavity 22 through the outlet 32 is reduced by from about 17 dB at about 48 MHz. Continuing with FIG. 6, as one example, $y_1$ can equal 0 dB µV/m, $y_2$ can equal 5 dB µV/m, $y_3$ can equal 10 dB µV/m, $y_4$ can equal 15 dB µV/m, $y_5$ can equal 20 dB µV/m, $y_6$ can equal 25 dB µV/m, $y_7$ can equal 30 dB µV/m, $y_8$ can equal 35 dB µV/m, $y_9$ can equal 40 dB µV/m, $y_{10}$ can equal 45 dB µV/m, $y_{11}$ can equal 50 dB µV/m, $y_{12}$ can equal 55 dB µV/m, $x_1$ can equal 45 MHz, $x_2$ can equal 50 MHz, $x_3$ can equal 60 MHz, and $x_4$ can equal 65 MHz. It is to be appreciated that the values for $y_1$-$y_{12}$ and $x_1$-$x_4$ in the example above are for illustrative purposes only and other values can be utilized.

While the best modes for carrying out the disclosure have been described in detail, those familiar with the art to which this disclosure relates will recognize various alternative designs and embodiments for practicing the disclosure within the scope of the appended claims.

The invention claimed is:

1. An electromagnetic interference reduction assembly for a transmission of a vehicle, the assembly comprising:
   a transmission casing including a base and a plurality of walls extending outwardly away from the base to a distal edge, with the transmission casing defining a first cavity between the walls and including a platform disposed between the walls to further define the first cavity;
   a power inverter module disposed in the first cavity and supported by the platform when in the first cavity, with the power inverter module generating electrical noise during operation which produces electromagnetic interference;
   a lid attached to the distal edge of the walls of the transmission casing to contain the power inverter module inside the first cavity; and
   a connector plug extending from the power inverter module;
   a grounding member surrounding the connector plug and the grounding member engaging the power inverter module and the lid when the lid is attached to the transmission casing to electrically connect the power inverter module to the lid to reduce the electrical noise exiting the first cavity which reduces the electromagnetic interference exiting the first cavity.

2. An assembly as set forth in claim 1 wherein the connector plug is configured to electrically connect the power inverter module to the vehicle.

3. An assembly as set forth in claim 2 wherein the grounding member defines an aperture, with the connector plug disposed through the aperture such that the grounding member surrounds the connector plug.

4. An assembly as set forth in claim 3 wherein the lid defines an outlet, with the connector plug disposed through the outlet and the electrical noise exiting the first cavity through the outlet such that the electromagnetic interference exits the first cavity through the outlet.

5. An assembly as set forth in claim 4 wherein the grounding member includes at least one tab extending outwardly toward the lid, with the tab engaging the lid when the lid is attached to the transmission casing to return the electrical noise back inside the first cavity to the power inverter module away from the outlet to reduce the electromagnetic interference exiting the outlet.

6. An assembly as set forth in claim 5 wherein the at least one tab is further defined as a plurality of tabs spaced from each other about the connector plug, with each of the tabs engaging the lid when the lid is attached to the transmission casing to return the electrical noise back inside the first cavity to the power inverter module away from the outlet to reduce the electromagnetic interference exiting the outlet.

7. An assembly as set forth in claim 6 wherein the lid includes an inner surface facing inside the first cavity when the lid is attached to the transmission casing, with the tabs of the grounding member engaging the inner surface to electrically connect the power inverter module to the lid and the transmission casing.

8. An assembly as set forth in claim 7 wherein the power inverter module includes a circuit board electrically connected to the connector plug for electrically connecting the power inverter module to the vehicle, and wherein the power inverter module includes a cover disposed over the circuit board, with the cover defining a hole and the connector plug extending through the hole, and with the tabs extending through the hole such that the tabs are exposed outside of the cover to engage the inner surface of the lid when the lid is attached to the transmission casing.

9. An assembly as set forth in claim 6 wherein the grounding member is formed of steel such that the tabs are elastically deformable when engaging the lid to maintain engagement of the tabs with the lid.

10. An assembly as set forth in claim 2 wherein the lid defines an outlet, with the connector plug disposed through the outlet and the electrical noise exiting the first cavity through the outlet such that the electromagnetic interference exits the first cavity through the outlet.

11. An assembly as set forth in claim 10 wherein the electrical noise exiting the first cavity through the outlet is reduced by from about 10 dB to about 20 dB over a range of from about 40 MHz to about 60 MHz.

12. An assembly as set forth in claim 10 wherein the electrical noise exiting the first cavity through the outlet is reduced by from about 13 dB to about 18 dB over a range of from about 45 MHz to about 55 MHz.

13. An assembly as set forth in claim 2 wherein the power inverter module includes a circuit board electrically connected to the connector plug for electrically connecting the power inverter module to the vehicle.

14. An assembly as set forth in claim 13 further including an insulator disposed about the connector plug, with the insulator disposed between the circuit board and the grounding member to prevent short circuiting of the circuit board.

15. An assembly as set forth in claim 14 wherein the insulator is formed of a non-conductive material to insulate the circuit board and the grounding member from each other.

16. An assembly as set forth in claim 13 further including a first coupler attached to the grounding member and the circuit board to connect together the grounding member and the circuit board.

17. An assembly as set forth in claim 16 further including a second coupler spaced from the first coupler, with the second coupler attached to the grounding member and the circuit board to connect together the grounding member and the circuit board.

18. An assembly as set forth in claim 2 further including a wire harness coupled to the connector plug for electrically connecting the power inverter module to the vehicle.

19. An assembly as set forth in claim 1 wherein the power inverter module includes a grounding plate, with the grounding member electrically coupled to the grounding plate to electrically connect the power inverter module to the lid.

20. An electromagnetic interference reduction assembly for a transmission of a vehicle, the assembly comprising:
- a transmission casing including a base and a plurality of walls extending outwardly away from the base to a distal edge, with the transmission casing defining a first cavity and a second cavity between the walls and including a platform disposed between the walls to separate the first and second cavities, with the first cavity disposed adjacent to the distal edge of each of the walls;
- a power inverter module disposed in the first cavity and supported by the platform when in the first cavity, with the power inverter module generating electrical noise during operation which produces electromagnetic interference;
- a connector plug extending from the power inverter module for electrically connecting the power inverter module to the vehicle;
- a lid attached to the distal edge of the walls of the transmission casing to contain the power inverter module inside the first cavity, with the connector plug extending through the lid; and
- a grounding member surrounding the connector plug and including a plurality of tabs spaced from each other about the connector plug, with the grounding member engaging the power inverter module and each of the tabs engaging the lid when the lid is attached to the transmission casing to electrically connect the power inverter module to the lid to reduce the electrical noise exiting the first cavity which reduces the electromagnetic interference exiting the first cavity.

\* \* \* \* \*